(12) United States Patent
Jimbo et al.

(10) Patent No.: US 7,781,035 B2
(45) Date of Patent: Aug. 24, 2010

(54) CONTAINER FOR PRECISION SUBSTRATE

(75) Inventors: Toshihiko Jimbo, Kanagawa-ken (JP);
Toshihide Murakami, Kanagawa-ken (JP); Tadahiro Ohmi, 301, 1-17, Komegafukuro 2-chome, Aoba-ku, Sendai-shi, Miyagi 980-0813 (JP)

(73) Assignees: Zeon Corporation, Tokyo (JP); Tadahiro Ohmi, Sendai-shi (JP)

( * ) Notice: Subject to any disclaimer, the term of this patent is extended or adjusted under 35 U.S.C. 154(b) by 1249 days.

(21) Appl. No.: 10/487,840

(22) PCT Filed: Aug. 28, 2002

(86) PCT No.: PCT/JP02/08652
§ 371 (c)(1),
(2), (4) Date: Feb. 27, 2004

(87) PCT Pub. No.: WO03/021665
PCT Pub. Date: Mar. 13, 2003

(65) Prior Publication Data
US 2004/0224110 A1    Nov. 11, 2004

(30) Foreign Application Priority Data
Aug. 28, 2001   (JP) .................... 2001-257460

(51) Int. Cl.
*B32B 1/02* (2006.01)
*B32B 27/00* (2006.01)
*B32B 1/08* (2006.01)

(52) U.S. Cl. .................. 428/35.7; 428/34.1; 428/34.2; 428/35.9; 428/36.9

(58) Field of Classification Search ............... 428/34.1, 428/35.7, 35.9, 36.9, 34.2
See application file for complete search history.

(56) References Cited

U.S. PATENT DOCUMENTS

| | | | |
|---|---|---|---|
| 5,187,012 A | 2/1993 | Takahashi et al. | ........... 428/402 |
| 5,936,048 A * | 8/1999 | Oishi et al. | ................. 525/523 |
| 6,525,144 B1 * | 2/2003 | Tanahashi et al. | ........ 525/332.1 |

FOREIGN PATENT DOCUMENTS

EP   0 436 372   7/1991

(Continued)

OTHER PUBLICATIONS

European Search Report dated Jun. 16, 2009, issued in corresponding European Patent Application No. 02760759.

*Primary Examiner*—Marc A Patterson
(74) *Attorney, Agent, or Firm*—Westerman, Hattori, Daniels & Adrian, LLP (57) ABSTRACT

A container for precision substrate having one or more component formed by molding a thermoplastic resin, characterized in that the component satisfies characteristics [1] and [2] below. [1] When being brought to contact ultra high purity argon gas (impurity concentration: 1 ppb or less) at 25° C. having a flow rate of 1.2 L/min., a water amount in said argon gas after 300 minutes is 30 ppb or less per a surface area 1 cm$^2$ of the component. [2] When being placed in the air at 100° C., an increase amount of organics in the air in 300 minutes is 150 ng or less per weight 1 g of the component. According to the container, demands for low contamination can be satisfied.

14 Claims, 1 Drawing Sheet

FOREIGN PATENT DOCUMENTS

| | | |
|---|---|---|
| EP | 0436030 A1 | 7/1991 |
| EP | 0969497 A2 | 1/2000 |
| JP | 3-223328 | 10/1991 |
| JP | 8-288377 | 11/1996 |
| JP | 11-74337 | 3/1999 |
| JP | 11-163115 | 6/1999 |
| JP | 11-307622 | 11/1999 |
| JP | 2000-7085 | 1/2000 |
| JP | 2000-63505 | 2/2000 |
| JP | 2000-143833 | 5/2000 |
| JP | 2001-192458 | 7/2001 |
| JP | 2001-200143 | 7/2001 |

* cited by examiner

CONTAINER FOR PRECISION SUBSTRATE

TECHNICAL FIELD

The present invention relates to a container for precision substrate used for storing and carrying a precision substrate, such as a wafer substrate for producing a semiconductor, a mask plate, a photomask, a magnetic disk substrate and a liquid crystal display substrate, a production method of components of the container for precision substrate and a storing method of a precision substrate by using the container for precision substrate.

BACKGROUND ART

In a field of a semiconductor chip, a liquid crystal display device and other electronic devices, along with the devices getting highly integrated, a decline of quality caused by fine particles (even a size of 0.1 μm or so matters), water and organic substances, etc. being mixed therein in the production procedure has been a major matter. Therefore, storage and carrying of a silicon wafer substrate, liquid crystal display substrate and other precision substrates used for producing the devices have to be under an environment where the above contaminating substances are reduced as much as possible.

Thus, a process for storing and carrying these precision substrates by keeping them in an airtight container wherein the inside is highly cleaned to be in a state of being isolated from an outside environment is used.

Also, to prevent fine particles and other contaminating substances from adhering to a precision substrate housed in the container, inside the container was filled with a clean air or an inert gas, however, demands for less contamination have become furthermore stronger in recent years, so a method of making the inside a vacuum or reduced pressure state has been proposed. A container, an inside thereof is in a reduced pressure or vacuum state, is required to be highly airtight and pressure tight, moreover, not to emit water, organic substances and other contaminating substances from the container itself. A metal container is known as a container satisfying the demands.

However, a metal container is heavy, a precision substrate inside cannot be observed, and the production cost is high. Thus, studies have been pursued for obtaining a container satisfying the above demands by using a thermoplastic resin.

A molded item of a thermoplastic resin generally releases water and organic substances, however, it is known that a container made by a cyclic olefin resin gives small contamination on its contents (the Japanese Unexamined Patent Publication No. 11-74337).

However, even the technique described in this publication is insufficient to deal with the recent demands for less contamination.

DISCLOSURE OF THE INVENTION

An object of the present invention is to provide a container for precision substrate capable of satisfying requirements of low contamination, a process for producing components of the container for precision substrate, and a process for storing a precision substrate by using the container for precision substrate.

The present inventors have been committed themselves to study for attaining the above objects, found that an adhesion amount of contaminating substances becomes remarkably small even stored or carried, etc. for a long time when keeping a precision substrate in a container produced by a certain part made by molding a thermoplastic resin, which releases not more than a specific amount of water and organic compounds when being under specific conditions, and completed the present invention based on the knowledge.

Namely, according to the present invention, there is provided a container for precision substrate having one or more component formed by molding a thermoplastic resin, characterized in that said component satisfies characteristics [1] and [2] below.

[1] When being brought to contact ultra high purity argon gas (impurity concentration: 1 ppb or less) at 25° C. having a flow rate of 1.2 L/min., a water amount in said argon gas after 300 minutes is 30 ppb or less per a surface area 1 $cm^2$ of the component.

[2] When being placed in the air at 100° C., an increase amount of organics in the air in 300 minutes is 150 ng or less per weight 1 g of the component.

Preferably, a thermoplastic resin is a polymer resin containing alicyclic structure.

Preferably, the polymer resin containing alicyclic structure includes 30 to 100 wt % of repeating units originating from a monomer containing alicyclic structure.

Preferably, the polymer resin containing alicyclic structure is a ring-opening (co)polymer of a norbornene based monomer or a hydride of the polymer.

Preferably, the polymer resin containing alicyclic structure has a polymerization conversion rate of 95 wt % or more.

Preferably, the polymer resin containing alicyclic structure has weight average molecular weight (Mw) of 5,000 to 500,000, and the weight average molecular weight is a value in a polyisoprene conversion measured by a gel permeation chromatography (GPC) of a hexane solution (a toluene solution when the polymer resin does not dissolve).

Preferably, the polymer resin containing alicyclic structure includes 0.15 wt % or less of carbon-carbon-double bond with respect to a total amount of all carbon-carbon bonds.

Preferably, the polymer resin containing alicyclic structure has a melt index of 0.1 to 30 g/10 min., and the melt index is a value measured at 230° C. based on the JIS-K7210.

Preferably, the polymer resin containing alicyclic structure has a melt index of 2 to 100 g/10 min., and the melt index is a value measured at 280° C. based on the JIS-K7210.

According to the present invention, there is provided a process for producing a container for precision substrate, characterized by producing a component of a container for precision substrate by using a molding material including a preliminarily dried polymer resin containing alicyclic structure.

Preferably, the preliminary drying of a polymer resin containing alicyclic structure is preformed under a condition of a temperature lower than a glass transition temperature of the polymer resin containing alicyclic structure by 5° C. to 80° C. for 2 hours or longer but not longer than 10 hours.

Preferably, a molding material stored by being sealed with nitrogen is used.

Preferably, a component of a container for precision substrate is produced by using a polymer resin containing alicyclic structure having a melt index of 0.1 to 30 g/10 min., wherein the melt index is a value measured at 230° C. based on the JIS-K7210, and performing injection molding under a condition below.

Resin temperature when molding: 220 to 330° C.

Retention time of molten resin in cylinder: 1 hour or shorter

Preferably, a component of a container for precision substrate is produced with a molding material including a polymer resin containing alicyclic structure having a melt index of 2 to 100 g/10 min., wherein the melt index is a value measured at 280° C. based on the JIS-K7210, and performing injection molding under a condition below.

Resin temperature when molding: 220 to 330° C.

Retention time of molten resin in cylinder: 1 hour or shorter

According to the present invention, there is provided a process for storing a precision substrate, characterized by using any one of the above container for precision substrate and making inside the container a vacuum state for storing the precision substrate.

Preferably, a container for precision substrate comprising a container body having an opening portion and capable of housing a precision substrate inside, and a container cap capable of forming a closed space between said container body and itself by covering the opening portion of the container body and jointing is used, and a step of placing a precision substrate inside said container body;

a step of reducing a pressure of an atmosphere wherein the container body housing the precision substrate is placed from a normal pressure to a vacuum state;

a step of covering an opening portion of the container body after pressure reducing with said container cap and storing the precision substrate in the container in an airtight state; and a step of bringing an atmosphere wherein the container storing the precision substrate is placed to a normal pressure, are included.

The container for precision substrate according to the present invention can be used for storing and carrying a variety of precision substrates, such as a wafer substrate for producing a semiconductor (wafer substrate, etc. under processing a silicon wafer substrate and integrated circuit chip), a mask plate, a photomask, a magnetic disk substrate, and a liquid crystal display substrate, etc.

The container for precision substrate according to the present invention satisfies demands for low contamination and does not contaminate precision substrates stored therein, so that a defective fraction of electronic devices produced by using the substrates can be made widely small.

According to the process for producing components of the container for precision substrate according to the present invention, components of the container for precision substrate of the present invention explained above can be produced efficiently.

According to the storing method of a precision substrate according to the present invention, contamination on the precision substrate by suspended substances in the air can be effectively prevented.

DETAIL DESCRIPTION OF THE INVENTION

Container for Precision Substrate

A container for precision substrate according to the present invention is composed of at least two components which can be divided at least to two. It has the configuration that, after placing a precision substrate in at least one component among at least two components, the precision substrate can be stored in a closed space obtained by putting the rest of the components together.

Components

Namely, a container for precision substrate according to the present invention comprises at least a first component having an opening portion and being capable of holding a precision substrate inside, and a second component capable of forming a closed space with the first component by covering and jointing with the opening portion of the first component.

The first component normally has the largest capacity in the present invention and configures the container body. The second component is capable of forming a closed space by covering and jointing with the opening portion of the container body and configures a container cap.

The container body has an opening portion for holding a precision substrate. A shape of the container body is not particularly limited, and may be any of a cylinder shape, a bowl shape, a dish shape and a prism shape, etc. Note that a cylinder shape and a prism shape are preferable to hold a plurality of precision substrates (mainly circular plates and rectangular plates). In this case, a side wall of the container body may be vertical, widened or narrowed from the container bottom. Also, in the container body, the opening portion has a flange portion for being put together with a container cap.

A shape of the container cap is not particularly limited as far as it can cover and joint with the opening portion of the container body, but a plate shape, a bowl shape or a dish shape is preferable. Note that when the container cap is a bowl shape or a dish shape, the precision substrate may be also held in the container cap.

A positional relationship of the container body and the container cap is not particularly limited and may be, for example, a relationship of placing a precision substrate on the back side of the container cap and cover from above with the container body.

The opening portion and a joining face with the container cap of the container body preferably have the configuration of keeping inside the container airtight by tight contact (for example, configuration of contacting a plane with a plane).

Preferably, other than the above container body and the container cap, the container for precision substrate according to the present invention further comprise a third component for making the two tightly contact. Specifically, a part for sealing jointing faces of the opening portion of the container body and the container cap (a gasket, a packing, an O-ring, etc.), and a part for tightly jointing the container body and the container cap (a clamp, a clip and other cramping jigs), etc. may be mentioned. The part for sealing the jointing faces of the container body and the container cap is preferably configured by a flexible resin, thermoplastic elastomer, rubber, etc.

A capacity of the closed space (a precision substrate housing portion) formed by the container body and the container cap is normally 0.2 to 300 liters, preferably 1 to 150 liters, more preferably 3 to 50 liters.

In the present invention, preferably, both of the container body and the container cap explained above (both correspond to the components of the present invention) satisfy characteristics [1] and [2] below.

[1] When being kept contacting an ultra high purity argon gas (impurity concentration: 1 ppb or less) at 25° C. having a flow speed of 1.2 L/min., a water amount (released water amount) in the argon gas after 300 minutes is 30 ppb or less (preferably 20 ppb or less, more preferably 10 ppb or less, particularly preferably 5 ppb or less) per 1 $cm^2$ of the surface area of the components.

[2] When being placed in the air at 100° C., an increase amount of organics in the air (a released organic amount) in 300 minutes is 150 ng or less (preferably 100 ng/g or less, more preferably 50 ng/g or less) per 1 g of the weight of the components.

When the released water amount per 1 $cm^2$ of the surface area of the components exceeds 30 ppb, for example, when a silicon wafer substrate is stored in the container, a natural oxidation film is generated on the surface of the wafer substrate, so an insulation defect or other defects are liable to arise when a semiconductor element is produced with the wafer substrate. When the released organic amount per 1 g of the weight of the components exceeds 150 ng, the released organics easily adhere to the silicon wafer substrate, and yields and reliability of production decline.

A measuring method of the released water amount will be explained. First, a test piece is cut out from a part immediately after molding or from a part subjected to ultrasonic cleaning with ultrapure water for 10 minutes, subjected to precision cleaning by purging with high purity nitrogen, stored in a clean room after molding, and stored. Cutting of the test piece and storage of the cut test piece are performed under an environment of a relative humidity of 20 to 85%, preferably 35 to 60% in order to prevent adsorption or absorption of water from the environment. The test piece is cut to have a longest length of 50 to 300 mm when measured in a random direction and a surface area of 5 to 200 $cm^2$ including the cut faces. Next, the released water amount of the test piece is measured. The measurement of the released water amount is obtained by leaving the test piece in an air flow of a super high purity argon gas having an impurity concentration of 1 ppb or less and a flow speed of 1.2 L/min. at a temperature of 25° C. to keep it contact the high purity argon gas, and measured a water amount in the argon gas by an atmospheric pressure ionization mass spectrometer (hereinafter, abbreviated to "API-MS") after 300 minutes. Note that when a container part of a test piece is stored under a low humidity environment for a long time, water is released from the test piece before the test and a correct measurement value cannot be obtained. Thus, time from molding of a part or precision cleaning to the measurement is normally within 48 hours, preferably within 24 hours.

A method of measuring a released organic amount will be explained. Conditions of producing a test piece is the same as that of the test piece used in measuring a released water amount explained above. Note that the test piece is cut to have a longest length of 50 to 300 mm when measured in a random direction and a weight of 0.5 to 20 g. Next, a released organic amount of the test piece is measured. Measurement of a released organic amount is made on the test piece by using a thermal desorption gas chromatography: a mass spectrometer (TDS-GC-MS) at 100° C. for 300 minutes. Note that the cut test piece is stored in a class 100 clean room and normally subjected to measurement within 48 hours, preferably 24 hours, from molding or precision cleaning of the part.

Organics to be released into the air are composed of
(1) unreacted monomers, oligomers or decomposed substances thereof in a thermoplastic resin,
(2) antioxidants blended in a resin or decomposed substances thereof (for example, butyl hydroxyl toluene (BHT), dilauryl thiodipropionate, etc.),
(3) plasticizers (for example, dioctyl phthalate (DOP), dibutyl phthalate (DBP) and other phthalate esters; tributyl phosphate (TBP), triethyl phosphate (TEP) and other phosphate esters; butyl oleate and other fatty acid esters; dioctyl adipate (DOA) and other adipates, etc.),
(4) residual agents in a resin (for example, acetone, toluene, xylene, dichloro benzene, cyclohexane, etc.),
(5) light stabilizers, cross-linking agents, lubricants, antistatic agents and other additives.

In the present invention, the container body and container cap explained above are preferably formed by molding a thermoplastic resin.

Thermoplastic Resin

A thermoplastic resin which can be used in the present invention is not particularly limited as far as the above components made as its molded items has a quality on a released water amount and released organic amount explained above, and the molded item can be made to be transparent.

As such a thermoplastic resin, a polymer resin containing alicyclic structure, polycarbonate, polybutylene terephthalate, polyethylene terephthalate, polyethylene naphthalate, polyimide, polymethyl methacrylate, polyetheretherketone, polyphenylene sulfide, polyphenyl ether, polysulfine, polyimide, polyethylene and polypropylene, etc. may be mentioned. Among them, a polymer resin containing alicyclic structure is preferable.

A polymer resin containing alicyclic structure which can be used in the present invention indicates a polymer being a resin containing 20 wt % or more of repeating units originating from a monomer containing alicyclic structure.

As an alicyclic structure, monocyclic and polycyclic (condensed polycyclic, cross-linked cyclic, and polycyclic combining the two, etc.) may be mentioned. The number of carbon atoms composing an alicyclic structure is not particularly limited, but is normally 4 to 30, preferably 5 to 20, more preferably 5 to 15. When the number of carbons in the alicyclic structure is in the above range, it is preferable because characteristics, such as mechanical strength, heat resistance and moldability, are highly balanced.

A containing ratio of repeating units originating from a monomer containing alicyclic structure in the polymer resin containing alicyclic structure is normally 20 to 100 wt %, preferably 30 to 100 wt %. When the ratio of repeating units originating from a monomer containing alicyclic structure is excessively small, it is not preferable because heat resistance becomes poor.

A remaining portion other than the repeating units originating from a monomer containing alicyclic structure in the polymer resin containing alicyclic structure is suitably selected in accordance with a use object.

As a polymer resin containing alicyclic structure, a norbornene based polymer, monocyclic cycloalkene based polymer and a vinyl cycloalkane based polymer, etc. are mentioned.

A norbornene based polymer is a polymer obtained by performing addition (co)polymerization or ring-opening (co)polymerization on a norbornene based monomer and hydrogenating an unsaturated bond portion thereof in accordance with need.

A monocyclic cycloalkene polymer is a polymer obtained by performing addition (co)polymerization on a monocyclic cycloalkene monomer or an alicyclic conjugated diene monomer and hydrogenating an unsaturated bond portion thereof in accordance with need.

A vinyl cycloalkane based monomer is a polymer of vinyl cycloalkane; a hydrogenate of an unsaturated bond portion of a copolymer of a polymer of vinyl cycloalkane or vinyl cycloalkane and other monomer which can be copolymerized with vinyl cycloalkene; and a hydrogenate of an aromatic ring and olefin unsaturated bond portion of a copolymer of an aromatic vinyl based polymer or an aromatic vinyl compound and other monomer which can be copolymerized.

Among them, a ring-opening (co)polymer of a norbornene based monomer and a hydrate thereof are preferable, and those containing as a (co)polymerization component a norbornene based monomer not having a norbornane ring are more preferable.

Note that, in the explanation below, a norbornene based monomer, a monocyclic cycloalkene, alicyclic conjugated diene and vinyl cycloalkene will be also referred to as "a monomer containing alicyclic structure".

As a monomer containing alicyclic structure, norbornene based monomers not having a norbornane ring, norbornene based monomers having a norbornane ring, monocyclic cycloalkene, alicyclic conjugated diene and vinyl alicyclic carbon hydrides, etc. may be mentioned.

As a norbornene based monomer not having a norbornane ring, bicyclo[2.2.1]hept-2-ene (common name: norbornene), 5-methyl-bicyclo[2.2.1]hept-2-ene, 5,5-dimethyl-bicyclo[2.2.1]hept-2-ene, 5-ethyl-bicyclo[2.2.1]hept-2-ene, 5-butyl-bicyclo[2.2.1]hept-2-ene, 5-hexyl-bicyclo[2.2.1]hept-2-ene, 5-octyl-bicyclo[2.2.1]hept-2-ene, 5-octadecyl-bicyclo[2.2.1]hept-2-ene, 5-ethylidene-bicyclo[2.2.1]hept-2-ene, 5-methylidene-bicyclo[2.2.1]hept-2-ene, 5-vinyl-bicyclo[2.2.1]hept-2-ene,     5-propenyl-bicyclo[2.2.1]hept-2-ene, 5-methoxy-carbonyl-bicyclo[2.2.1]hept-2-ene, 5-cyano-bicyclo[2.2.1]hept-2-ene, 5-methyl-5-methoxycarbonyl-bicyclo[2.2.1]hept-2-ene, 5-ethoxycarbonyl-bicyclo[2.2.1]hept-2-ene, bicyclo[2.2.1]hept-5-enyl-2-methylpropionate, bicyclo[2.2.1]hept-5-enyl-2-methyl octanate,   bicyclo[2.2.1]hept-2-ene-5,6-dicarboxylic anhydride, 5-hydroxymethyl bicyclo[2.2.1]hept-2-ene, 5,6-di(hydroxymethyl)-bicyclo[2.2.1]hept-2-ene, 5-hydroxy-1-propyl bicyclo[2.2.1]hept-2-ene, 5,6-dicarboxy-bicyclo[2.2.1]hept-2-ene, bicyclo[2.2.1]hept-2-ene-5,6-dicarboxylic acid imide, 5-cyclopontyl-bicyclo[2.2.1]hept-2-ene, 5-cyclohexyl-bicyclo[2.2.1]hept-2-ene, 5-cyclohexenyl-bicyclo[2.2.1]hept-2-ene, 5-phenyl-bicyclo[2.2.1]hept-2-ene,   tricyclo[4.3.0.1$^{2,5}$]deca-3,7-diene (common name: dicyclopentadiene), tricyclo[4.3.0.1$^{2,5}$]deca-3-ene, tricyclo[4.4.0.1$^{2,5}$] undeca-3,7-diene, tricyclo[4.4.0.1$^{2,5}$] undeca-3,8-diene, tricyclo[4.4.0.1$^{2,5}$] undeca-3-ene, 7,8-benzotricyclo[4.3.0.1$^{2,5}$]deca-3-ene (alias: 1,4-methano-1,4,4a,9a-tetrahydrofluorene), 8,9-benzotricyclo[4.4.0.1$^{2,5}$] undeca-3-ene (alias: 1,4-methano-1,4,4a,5,10,10a-hexahydroanthoracene), etc. may be mentioned.

As a norbornene based monomer having a norbornane ring, tetracyclo[4.4.0.1$^{2,5}$.1$^{7,10}$]dodeca-3-ene (common name: tetracyclododecene), 8-methyl-tetracyclo[4.4.0.1$^{2,5}$.1$^{7,10}$] dodeca-3-ene, 8-ethyl-tetracyclo[4.4.0.1$^{2,5}$.1$^{7,10}$]-1dodeca-3-ene, 8-methylidene-tetracyclo[4.4.0.1$^{2,5}$.1$^{7,10}$]dodeca-3-ene, 8-ethylidene-tetracyclo[4.4.0.1$^{2,5}$.1$^{7,10}$]dodeca-3-ene, 8-vinyl-tetracyclo[4.4.0.1$^{2,5}$.1$^{7,10}$]dodeca-3-ene, 8-propenyl-tetracyclo[4.4.0.1$^{2,5}$.1$^{7,10}$]dodeca-3-ene, 8-methoxycarbonyl-tetracyclo[4.4.0.1$^{2,5}$.1$^{7,10}$]dodeca-3-ene, 8-methyl-8-methoxycarbonyl-tetracyclo[4.4.0.1$^{2,5}$.1$^{7,10}$]dodeca-3-ene, 8-hydroxymethyl-tetracyclo[4.4.0.1$^{2,5}$.1$^{7,10}$]dodeca-3-ene, 8-carboxy-tetracyclo[4.4.0.1$^{2,5}$.1$^{7,10}$]dodeca-3-ene,     8-cyclopentyl-tetracyclo[4.4.0.1$^{2,5}$.1$^{7,10}$]dodeca-3-ene, 8-cyclohexyl-tetracyclo[4.4.0.1$^{2,5}$.1$^{7,10}$]dodeca-3-ene, 8-cyclohexenyl-tetracyclo[4.4.0.1$^{2,5}$.1$^{7,10}$]dodeca-3-ene, 8-phenyl-tetracyclo[4.4.0.1$^{2,5}$.1$^{7,10}$]dodeca-3-ene, penthacyclo[6.5.1.1$^{3,6}$.0$^{2,7}$.0$^{9,13}$]pentadeca-3,10-diene, pentacyclo[7.4.0.1$^{3,6}$.1$^{10,13}$.0$^{2,7}$]pentadeca-4,11-diene, etc. may be mentioned.

As a monocyclic cycloalkene, cyclobutene, cyclopentene, cyclohexene, 3,4-dimethylcyclopentene, 3-methylcyclohexene, 2-(2-methylbutyl)-1-cyclohexene, cyclooctene, 3a,5,6,7a-tetrahydro-4,7-methano-1H-indene, cycloheptene, etc. may be mentioned.

As an alicyclic conjugated diene, cyclopentadiene, cyclohexadiene, etc. may be mentioned.

As a vinyl alicyclic carbon hydride, vinyl cycloalkene, vinyl cycloalkane may be mentioned. As vinyl cycloalkene, vinyl cyclopentene, 2-methyl-4-vinylcyclopentene, vinyl cyclohexene, etc. may be mentioned. As vinyl cycloalkane, vinyl cyclopentane, 2-methyl-4-vinyl cyclopentane, vinyl cyclohexane, vinyl cyclooctane, etc. may be mentioned.

As an aromatic vinyl compound, styrene, α-methylstyrene, divinyl benzene, vinyl naphthalene, vinyl toluene, etc. may be mentioned.

The above monomers containing alicyclic structure and aromatic vinyl compounds may be used alone or in combination of two or more kinds.

A polymer resin containing alicyclic structure which can be used in the present invention may also be what obtained by copolymerizing the above monomer containing alicyclic structure or/and aromatic vinyl component and other monomer which can be copolymerized with a monomer containing alicyclic structure or an aromatic vinyl compound.

As other monomer which can be copolymerized with a monomer containing alicyclic structure or an aromatic vinyl compound, ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, 1-eicosen and other chain olefin; 1,4-hexadiene, 4-methyl-1,4-hexadiene, 5-methyl-1,4-hexadiene, 1,7-octadiene and other unconjugated dienes; etc. may be mentioned. These monomers may be used alone or in combination of two or more kinds.

A polymer resin containing alicyclic structure which can be used in the present invention may include a polar group. A ratio of repeating units containing a polar group, such as a hydroxyl group, a carboxyl group, an alkoxyl group, an epoxy group, a glycidyl group, an oxycarbonyl group, a carbonyl group, an amide group, an ester group and an acid anhydride group, in all repeating units composing the polymer resin containing alicyclic structure is normally 50 wt % or less, preferably 30 wt % or less, more preferably 10 wt % or less. When the ratio of the repeating units containing a polar group in the all repeating units of the polymer resin containing alicyclic structure is too large, water released from a molded item is liable to increase.

A polymerization method of a polymer resin containing alicyclic structure and a hydrogenation method performed in accordance with need are not particularly limited and may be performed by following well known methods.

A ring-opening polymer of a norbornene based monomer and monocyclic cycloalkane can be normally obtained by performing ring-opening polymerization in a solvent at a polymerization temperature of −50° C. to 100° C. under a polymerization pressure of 0 to 5 MPa by using as a ring-opening polymerization catalyst ruthenium, rhodium, palladium, osmium, iridium, platinum and other metal halides; a catalyst composed of a nitrite or an acetylacetone compound and a reducing agent; or a catalyst composed of titanium, vanadium, zirconium, tungsten, molybdenum and other metal halides or an acetylacetone compound and an organic aluminum compound as a cocatalyst.

An addition copolymer of an addition polymer of a norbornene based monomer and a mono cycloalkene or a monomer which can be copolymerized with these can be obtained by a method of copolymerizing, for example, a monomer component in the presence of a catalyst composed of titanium, zirconium or vanadium compound and an organic aluminum compound as a cocatalyst normally at a polymerization temperature of −50° C. to 100° C. under a polymerization pressure of 0 to 5 MPa.

A polymerization reaction of an aromatic vinyl compound, vinyl cycloalkene or vinyl cycloalkane may be made by any of well known methods, such as radical polymerization, an anionic polymerization and cationic polymerization, but anionic polymerization is preferable because there are tendencies that molecular weight of a polymer becomes small in cationic polymerization and molecular weight distribution becomes broad in radical polymerization, so mechanical strength of a molded item declines. Also, any of suspension polymerization, solution polymerization and block polymerization may be used. Among these polymers, an aromatic vinyl compound homopolymer, a hydride of a random and block copolymer containing 50 wt % or more of an aromatic vinyl compound unit are preferable. Styrene hydride homopolymer may be any of isotactic, syndiotactic and atactic.

When performing radical polym+erization, a radical initiator, such as azobisisobutyronitrile, benzoil peroxide, as a polymerization catalyst, and when performing cationic polymerization, $BF_3$, $BF_6$, etc. may be used as a polymerization catalyst.

In anionic polymerization, specifically, n-butyl lithium, 1,4-dilithiobutane and other organic alkali metals may be used as a polymerization catalyst in an organic solvent. On an object of securing mechanical strength and heat resistance, dibutylether, triethylamine or other Lewis base is added for obtaining a polymer having a narrow molecular weight distribution.

When successively performing hydrogenation reaction of a polymer after polymerization reaction, it is preferable for successively performing the steps when the polymerization reaction is solution polymerization for polymerizing in an organic solvent.

As an organic solvent used for anionic polymerization, a carbon hydride based solvent is preferable and, as those not undermining the polymerization solvent, for example, n-pentane, n-hexane, isooctane, and other fatty acid carbon hydrides; cyclopentane, cyclohexane, decalin and other alicyclic carbon hydrides; benzene, toluene and other aromatic carbon hydrides; and tetrahydrofuran, dioxane and other ethers; etc. may be mentioned. A use amount of an organic solvent is an amount by which a monomer concentration becomes normally 1 to 40 wt %, preferably 10 to 30 wt %.

Anionic polymerization is performed normally at −70 to 150° C., preferably −50 to 120° C. A polymerization time is normally 0.01 to 20 hours, preferably 0.1 to 10 hours.

Polymerization of alicyclic conjugated diene can be performed by well known methods, for example, described in the Japanese Unexamined Patent Publication No. 6-136057 and No. 7-258318.

A polymer resin containing alicyclic structure which can be used in the present invention has a polymerization conversion rate of normally 95 wt % or more, preferably 97 wt % or more, more preferably 99 wt % or more. When the polymerization conversion rate is too low, it is liable that an unreacted monomer is released form a molded item.

A polymer resin containing alicyclic structure which can be used in the present invention is preferably obtained by hydrogenating carbon-carbon double bond of a ring, main chain and side chain after polymerization reaction. Specifically, it is preferable to perform hydrogenation, so that a containing ratio of carbon-carbon double bond with respect to the total amount of all carbon-carbon bond in the polymer resin containing alicyclic structure becomes normally 0.15 wt % or less, preferably 0.07 wt % or less, more preferably 0.02 wt % or less. A polymer resin containing alicyclic structure obtained by hydrogenating carbon-carbon double bond in the polymer is hardly deteriorated by oxidization and hardly releases organic substances, so that it easily contributes to attain the object of the present invention.

In the hydrogenation reaction, a reaction temperature, a hydrogen partial pressure, a reaction time and a reaction solution concentration are suitably set to be optimal ranges in accordance with a kind of polymer to be hydrogenated. A method of bringing a polymer solution contact a hydrogenation catalyst may be either of a method of adding a certain amount of a hydrogenation catalyst to the polymer solution and mixing in the presence of hydrogen in a reactor, and a method of letting the polymer solution and hydrogen passing through a fixed bed type reactor filled with a hydrogenation catalyst. In either cases, the reaction is made by using 0.01 to 50 parts by weight of a hydrogenation catalyst per 100 parts by weight of a polymer at a reaction temperature of 25 to 300° C. and a hydrogen partial pressure of 0.5 to 10 MPa for a reaction time of 0.5 to 20 hours with respect to 1 to 30 wt % organic solvent solution of a polymer containing alicyclic structure.

A hydrogenation catalyst is not particularly limited and a general hydrogenation catalyst can be used. For example, a homogeneous catalyst obtained by combining nickel, cobalt or other metal compound with organic aluminum or organic lithium is preferable. A carrier, such as an active carbon, diatomaceus earth and magnesia, is used in accordance with need. A use amount of a hydrogen catalyst is an amount by which a catalyst component becomes normally 0.03 to 50 parts by weight per 100 parts by weight of a polymer to be hydrogenated.

Volatile components, such as a solvent, are removed from a solution after polymerization when hydrogenation reaction is not performed after polymerization reaction of a polymer resin containing alicyclic structure, and from a solution obtained by filtrating a reaction solution after completing hydrogenation reaction to separate a hydrogenation catalyst when hydrogenation reaction is performed after polymerization.

As a method of removing the solvent and other volatile components, coagulation method, direct drying method and other well known methods can be applied.

A coagulation method is a method of depositing a polymer by mixing a polymer solution with a poor solvent of the polymer. As a poor solvent, for example, ethyl alcohol, n-propyl alcohol, isopropyl alcohol and other alcohols; acetone, methylethylketone and other ketones; polar solvents of ethyl acetate, butyl acetate and other esters may be mentioned. After the solid-liquid separation by coagulation, small blocks of the polymer (crams) are dried by heating to remove the solvent.

The direct drying method is a method of removing a solvent by heating a polymer solution under a reduced pressure. This method can be performed by using a well known device, such as a centrifugal thin film continuous evaporation drier, a scraping face heat exchange type continuous reactor type drier, and a high viscosity reactor device. A degree of vacuum and a temperature are suitably selected in accordance with a device and not limited.

After removing a solvent by coagulation and direct drying, it is preferable to furthermore dry by heating under a reduced pressure. The pressure at that time is normally 10 kPa or less, preferably 3 kPa or less, and a heating temperature is normally 260° C. or more, preferably 280° C. or more. When drying under such conditions, almost no unreacted monomer and solvent are left in the polymer, so that organics to be released from a molded item becomes less.

A polymer resin containing alicyclic structure which can be used in the present invention has weight average molecular weight (Mw) of normally 5,000 to 500,000, preferably 8,000 to 200,000, more preferably 10,000 to 100,000. The weight average molecular weight in this case is a value in a polyisoprene conversion measured by the gel permeation chromatography (GPC) of a hexane solution (a toluene solution in the case the polymer resin does not dissolve).

A polymer resin containing alicyclic structure which can be used in the present invention has a glass transition temperature (Tg) measured by a differential scanning calorimeter (DSC) at a temperature rising rate of 10° C./min. of normally 50 to 300° C., preferably 60 to 200° C., more preferably 70 to 160° C.

A polymer resin containing alicyclic structure which can be used in the present invention has a melt index measured at a temperature of 230° C. based on the JIS-K7210 of normally 0.1 to 30 g/10 min., preferably 0.1 to 10 g/10 min., more preferably 0.1 to 5 g/10 min. Also, the melt index measured at a temperature of 280° C. based on the JIS-K7210 is normally 2 to 100 g/10 min., preferably 3 to 50 g/10 min., more preferably 5 to 30 g/10 min. When the melt index of a polymer resin containing alicyclic structure is in the above range, molding can be performed at a relatively low temperature, moreover, since molten fluidity is favorable, partial temperature rising at molding is hard to occur, so that generation of low molecular component along with decomposition and deterioration of the resin can be prevented.

Compounding Compound

A thermal plastic resin which can be used in the present invention can be blended with a rubbery polymer. Here, a rubbery polymer is a polymer having a Tg of 40° C. or lower. Rubber and thermal plastic elastomer are included in a rubbery polymer. When there are two or more glass transition temperatures like a block copolymer, those having the lowest glass transition temperature of 40° C. or less can be used as a rubbery polymer in the present invention. Mooney viscosity ($ML_{1+4}$: 100° C.) of a rubbery polymer is suitably selected in accordance with a use object, but is normally 5 to 300.

As a rubbery polymer which can be blended, ethylene-propylene rubber and other ethylene-α-olefin based rubbers; ethylene-α-olefin-polyene copolymer rubber; ethylene-methylmethacrylate, ethylene-butyl acrylate and other ethylene-unsaturated carboxylate ester copolymers; ethyl acrylate, butyl acrylate, hexyl acrylate, acrylic 2-ethylhexyl, lauryl acrylate and other alkyl acrylate ester based polymer; polybutadiene, low crystalline polybutadiene, polyisoprene, a random copolymer of styrene and butadiene or isoprene, acrylonitryle-butadiene copolymer, a butadiene-isoprene copolymer, butadiene-(metha)alkyl acrylate ester copolymer, a butadiene-(metha)alkyl acrylate ester-acrylonitryle copolymer, a butadiene-(metha)alkyl acrylate ester-acrylonitrile-styrene copolymer, a butylene-isoprene copolymer and other conjugated diene based rubbers; a styrene-butadiene block copolymer, a styrene hydroxide-butadiene block copolymer, a styrene hydroxide-butadiene random copolymer, a styrene-isoprene block copolymer, a styrene hydroxide-isoprene block copolymer and other aromatic vinyl-conjugated diene based block copolymer; styrene graft ethylene-propylene elastomer; a polyethylene terephthalate-poly(tetramethylene oxide)glycol block copolymer, a polyethylene terephthalate/isophthalate.poly(tetramethylene oxide)-glycol block copolymer, a polybutylene terephthalate/isophthalate-poly(tetramethylene oxide)glycol block copolymer, a polybutylene terephthalate/decanedicarboxylate-poly(tetramethylene oxide)glycol block copolymer and other polyester based thermoplastic elastomers; an ethylene based ionomer; etc. may be mentioned. Among these rubbery polymers, ethylene-α-olefin based rubber, conjugated diene based rubber, an aromatic vinyl-conjugated diene based block copolymer and polyester based thermoplastic elastomer, etc. are preferable. These rubbery polymers may be used alone or in combination of two or more kinds.

In the present invention, when a rubbery polymer is compounded in a thermoplastic resin, mechanical strength, such as impact strength, of a molded item (component) is improved, and the effect is particularly large in a polymer resin containing alicyclic structure. A compounding amount of a rubbery polymer is normally 1 to 50 parts by weight, preferably 3 to 30 parts by weight with respect to 100 parts by weight of a thermoplastic resin.

When the thermoplastic resin is a polymer resin containing alicyclic structure, mechanical strength can be improved also by compounding a small amount of other thermoplastic resin in a range of not undermining the capability. As other thermoplastic resin as such, for example, low-density polyethylene, high-density polyethylene, linear low-density polyethylene, ultra low-density polyethylene, an ethylene-ethyl acrylate copolymer, a ethylene-vinyl acetate copolymer, polypropylene and other α-olefin based resins; polystyrene, syndiotactic polystyrene, impact polystyrene (HIPS), a styrene-acrylonitrile copolymer (AS resin), styrene-acrylonitrile-butadiene copolymer (ABS), styrene-methyl methacrylate-butadiene copolymer (MBS) and other aromatic vinyl based resins; polymethyl methacrylate, polyvinyl chloride, polyvinylidene chloride, polyphenylene sulfide, polyphenylene ether, polyamide, polyester, polycarbonate, cellulose triacetate, polyetherimide, polyimide, polyacrylate, polysulfone, polyether sulfone, etc. may be mentioned. Among these, α-olefin based resin and an aromatic vinyl based resin are preferable. These thermoplastic resins may be used alone or in combination of two or more kinds, and the compounding amount is not particularly limited as far as it is in a range of not undermining the effect of the present invention.

A thermoplastic resin which can be used in the present invention may be suitably blended with a variety of compounding agents, such as an antioxidant, an ultraviolet absorbent, a weather resistant stabilizer, and an antistatic agent, in accordance with need.

As an antioxidant, a phenol based antioxidant, a phosphorus based antioxidant, and a sulfur based antioxidant, etc. may be mentioned. Among these, a phenol based antioxidant, particularly, alkyl-substituted phenol based antioxidant is preferable. Since these antioxidants can prevent coloring and a strength decline of a molded item due to deterioration by oxidization at the time of molding without deteriorating transparency and low water absorbing property of a thermoplastic resin, they are particularly important as compounding agents.

As a phenol based antioxidant, for example, octadecyl-3-(3,5-di-t-butyl-4-hydroxyphenyl)propionate, 2,2'-methylene-bis(4-methyl-6-t-butylphenol), 1,1,3-tris(2-methyl-4-hydroxy-5-t-butylphenyl)butane, 1,3,5-trimethyl-2,4,6-tris (3,5-di-t-butyl-4-hydroxybenzil)benzene, tetrakismethylene-3-(3',5'-di-t-butyl-4'-hydroxyphenyl propionate)methane [that is, pentaerythrityl-tetrakis3-(3,5-di-t- butyl-4-hydroxyphenyl propionate)] and other alkyl-substituted phenol based compounds; 2-t-butyl-6-(3-t-butyl-2-hydroxy-5-methylbenzil)-4-methylphenyl acrylate, 2,4-di-t-amyl-6-{1-(3,5-di-t-amyl-2-hydroxyphenyl)ethyl}phenyl acrylate and other acrylate based compounds; 6-(4-hydroxy-3,5-di-t-butylanilino)-2,4-bisoctylthio-1,3,5-triazine, 4-bisoctylthio-1,3,5-triazine and other phenol based compounds containing triazine group; etc. may be mentioned.

As a phosphorus based antioxidant, for example, triphenyl phosphate, diphenyl isodecyl phosphate, phenyl diisodecyl phosphate, tris(nonyl phenyl)phosphate, tris(dinonyl phenyl) phosphate, tris(2,4-di-t-butyl phenyl)phosphate and other monophosphite based compounds; 4,4'-butylidene-bis(3-methyl-6-t-butylphenyl-di-tridecyl phosphate) and other diphosphite based compounds; etc. may be mentioned.

As a sulfur antioxidant, for example, dilauryl-3,3-thiodipropionate, dimyristyl 3,3'-thiodipropionate, distearyl-3,3-thiodipropionate, laurylstearyl-3,3-thiopropionate, etc. may be mentioned.

These antioxidants may be used alone or in combination of two or more kinds, and the compounding amount is suitably selected but is normally 0.001 to 5 parts by weight, preferably 0.01 to 1 part by weight with respect to 100 parts by weight of a thermoplastic resin.

As an ultraviolet ray absorbent and weather resistant stabilizer, for example, 2,2,6,6-tetramethyl-4-piperidyl benzoate, bis(2,2,6,6-tetramethyl-4-piperidyl)sebacate, bis(1,2,2,6,6-pentamethyl-4-piperidyl)-2-(3,5-di-t-butyl-4-hydroxybenzil)-2-n-butylmalonate and other hindered amine based compounds; 2-(2-hydroxy-5-methylphenyl)benzotriazole, 2-(3-t-butyl-2-hydroxy-5-methylphenyl)-5-chlorobenzotriazole and other benzotriazole based compounds; 2,4-di-t-butylphenyl-3,5-di-t-butyl-4-hydroxybenzoate, hexadecyl-3,5-di-t-butyl-4-hydroxybenzoate and other benzoate compounds; etc. may be mentioned.

These ultraviolet ray absorbents and weather resistant stabilizers may be used alone or in combination of two or more kinds. An amount of ultraviolet ray absorbents and weather resistant stabilizers is normally in a range of 0.001 to 5 parts by weight, preferably 0.01 to 2 parts by weight with respect to 100 parts by weight of a thermoplastic resin.

As an antistatic agent, stearyl alcohol, behenyl alcohol and other long-chain alkyl alcohol; alkyl sulphonic acid sodium, alkyl sulphonic acid phosphonium salt; glycerin stearate ester and other fatty acid esters; hydroxylamine based compounds; alkyl phosphate amine; polyoxyethylene alkylamine; alkyldiethanolamide; a polyoxyethylene-polyoxypropylene block copolymer; an organic boron based surfactant; cation surfactant, amorphous carbon, tin oxide powder, antimonial tin oxide powder, etc. may be mentioned.

An amount of an antistatic agent is normally in a range of 0.1 to 50 parts by weight with respect to 100 parts by weight of a thermoplastic resin.

A thermoplastic resin which can be used in the present invention can be furthermore blended with a light stabilizer, near infrared ray absorbent, colorant, pigment and other coloring agents, lubricant, plasticizer, antiblocking agent, fluorescent brightening agent, deodorizer, organic or inorganic filler, dross-linking agent, and vulcanizing agent, etc. as other compounding agents in accordance with need. These can be used alone or in combination of two or more kinds, and the compounding amount is suitably selected in a range of not undermining the object of the present invention.

Production Method of Component

A container for precision substrate according to the present invention is, for example, composed of components of a container body and a container cap explained above, and in the explanation below, an example of a process for producing the components will be described.

First, a molding material (a molding resin composition) is prepared. The molding material may be composed only of the above explained thermoplastic resin, but is normally prepared by mixing with the above compounding components. Prior to the preparation of the molding material, it is preferable to dry the thermoplastic resin preliminarily. A condition of the preliminary drying is normally at a temperature lower than a glass transition temperature of the thermoplastic resin by 5° C. to 80° C., preferably by 1° C., 0 to 50° C., for 2 hours or longer but not longer than 10 hours, preferably 4 hours or longer and not longer than 8 hours. When the preliminary drying is performed under the condition, scorch of resin is suppressed when molding and a color tone of a molded item becomes transparent and colorless, which is preferable. The preliminary drying brings a large effect when the thermoplastic resin is a polymer resin containing alicyclic structure.

Preparation of the molding material is normally performed by melting and kneading the components at 160 to 350° C. by using a well known kneader, Banbury mixer, extruding machine or roll, etc. After the melting and kneading, it is normally molded to be a pellet form. Pellets are produced, after melting and kneading the molding material by an extruding machine, by extruding in strands having a diameter of 1 to 5 mm and cutting the strands by a pelletizer to be a length of 2 to 15 mm after cooling.

Next, by using the prepared molding material, a component is molded. As a molding method of a component, an injection molding, extruding blow molding, injection blow molding, multilayer blow molding, connection blow molding, double-wall blow molding, drawing blow molding, vacuum molding, rotary molding, press molding and molten extruding molding, etc. may be mentioned. Among these, injection molding is preferable. A resin temperature at the time of injection molding is normally 220 to 330° C., preferably 230 to 320° C., more preferably 240 to 300° C. when the thermoplastic resin included in the molding material is a polymer resin containing alicyclic structure. A cylinder retention time of a molten resin is normally 1 hour or shorter, preferably 30 minutes or shorter, more preferably 10 minutes or shorter. When injection molding is performed under a condition of the above range, thermal decomposition (deterioration) of the resin is less and generation of low molecular weight organics is suppressed.

Note that a certain time is taken from the preparation of the molding material until being provided for molding in some cases. In such cases, the molding material after preparation is preferably stored, for example, in a stainless container sealed with nitrogen. By storing the prepared molding material in sealed nitrogen, mixing of water and organics from an environment to the prepared molding material is prevented, moreover, a loss of transparency and blanching of a molded item (component) to be obtained are not caused, so that preferable appearance can be obtained.

Storage Method of Precision Substrate

As a process for storing a precision substrate by using a container for precision substrate according to the present invention, a method of simply housing the precision substrate in a container body under a normal pressure, then, covering with the container cap may be applied, but a method of making inside the container vacuum state for storing so as not to pollute the precision substrate with suspended substances in the air is preferable. Making inside the container vacuum state to store the precision substrate can be performed, for example, by after reducing a pressure in a room where the container body housing the precision substrate is placed from a normal pressure to a vacuum state, putting a cap on the container body, then, bringing the room back to the normal pressure.

The container for precision substrate according to the present invention has at least one component made by molding a thermoplastic resin having an extremely small released amount of water and organics as explained above. Therefore, on the precision substrate housed inside the container according to the present invention, adsorption of water and organics during storage is suppressed. Accordingly, for example, defects are reduced in semiconductor silicon wafer substrates and semiconductor elements molded by using the substrates and the yield is improved. For example, a capacitor produced by using a silicon wafer substrate housed and stored in the container for precision substrate according to the present invention has almost no defect due to being polluted by water and organics.

Components other than thermoplastic resin parts composing the container for precision substrate according to the present invention are not particularly limited and may be those produced from other thermoplastic resins, thermal curing resins, metals, glasses and ceramics, etc.

ONE EXAMPLE OF SPECIFIC CONFIGURATION

Next, a container for precision substrate according to the present invention will be explained based on an embodiment shown in drawings.

Figure 1A:
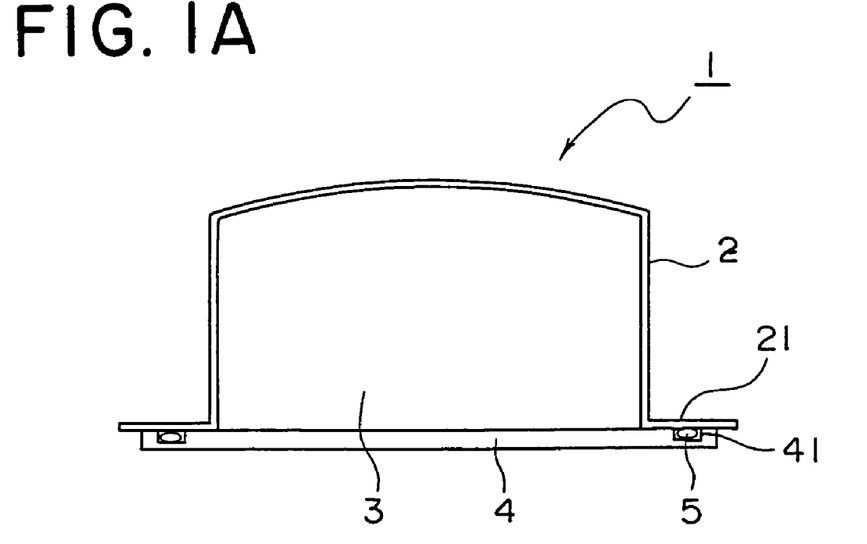
FIG. 1A is a schematic sectional view of a container for precision substrate according to an embodiment of the present invention.
Figure 1B:
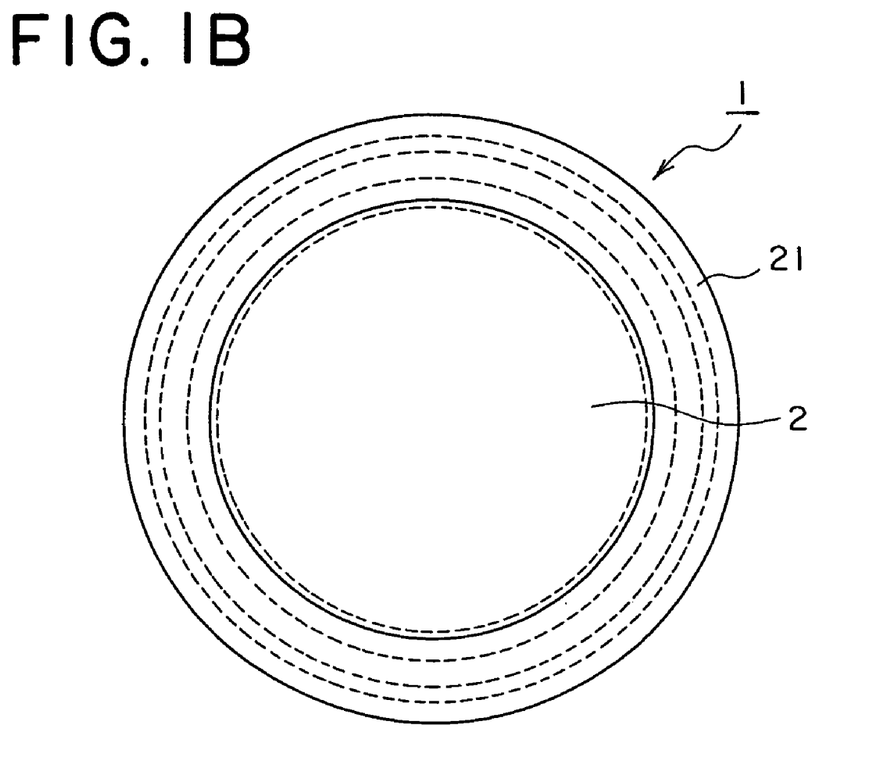
FIG. 1B is a plan view of the container for precision substrate in FIG. 1A.

As shown in FIG. 1A and FIG. 1B, a container for precision substrate 1 according to the present embodiment has a container body 2 (a first component) made by a polymer resin containing alicyclic structure.

The container body 2 has a hollow portion 3 for housing a precision substrate. The hollow portion 3 forms a closed space by the container body 2 and a container cap 4 (second component) made by a metal (for example, aluminum and stainless, etc.) for jointing at a flange portion 21 of the container body. A flange portion of the container cap 4 is formed a trench 41, and an O-ring 5 made by a rubbery polymer is arranged inside the trench 41.

In the present embodiment, an inner diameter of the hollow portion 3 of the container body 2 is preferably 150 to 300 mm. A height of the center of the hollow portion 3 is preferably 50 to 300 mm. A height of a sidewall of the hollow portion 3 is preferably 40 to 280 mm. Also, a thickness of the sidewall of the hollow portion 3 is preferably 2 to 15 mm.

Next, an example of a process for producing a container body 2 of the container for precision substrate 1 will be explained. First, a molding material is prepared. The molding material is obtained by melting and kneading a preliminarily dried polymer containing alicyclic structure and various compounding components, and made to be pellets. Next, the palletized molding material is subjected to injection molding and the container body 2 is obtained.

Next, an example of a process for storing a precision substrate by using the container for precision substrate 1 will be explained.

First, in a state that a plate shaped base (not shown) mounted with a precision substrate is covered with the container body 2 of the container for precision substrate 1 according to the present embodiment, a pressure is reduced in the room wherein the container 1 is placed. Soon, inside the room and the hollow portion 3 become a vacuum state. It becomes a vacuum state because there is not an O-ring at a joint portion of the container body 2 and the base and it is not airtight.

Next, the base is slid to one direction along the joint portion of the container body 2, and the container cap 4 (a flat plate having a trench for an O-ring at a joint portion with the container body 2) is slid to the other direction (the opposite direction from the sliding direction of the base) along the joint portion at the same time, so as to be replaced from the base.

Next, the room wherein the container 1 is placed is brought back to the normal pressure. Since the container body 2 and the container cap 4 are kept to be airtight by the O-ring 5 of the flange portion, the hollow portion 3 is kept to be vacuum state even when the outside of the container 1 becomes an atmospheric pressure.

As explained above, by using the container for precision substrate 1, the precision substrate can be stored in a vacuum state.

The container for precision substrate 1 according to the present embodiment comprises a container body 2 made by a polymer resin containing alicyclic structure which releases an extremely small amount of water and organics. Therefore, adsorption of water and organics during storage is suppressed on the precision substrate housed in the hollow portion 3. Accordingly, defects are reduced and the yield is improved, for example, in silicon wafer substrates for producing semiconductors and semiconductor elements molded by using the substrates.

Also, the a container body 2 made by a polymer resin containing alicyclic structure is light as having a specific weight of about 1, and is transparent, so that the storage condition of a precision substrate inside can be clearly observed and process management is easy.

EXAMPLES

Below, examples and comparative examples will be given for specifically explaining the present invention. Note that a "part" and "%" in examples are on weight basis unless otherwise mentioned.

<Test and Evaluation Method>

(1) Weight Average Molecular Weight (Mw), Number Average Molecular Weight (Mn): Weight average molecular weight (Mw) and number average molecular weight (Mn) were measured in a polystyrene conversion by the gel permeation chromatography (GPC) using cyclohexane as a solvent.

(2) Glass Transition Temperature:

A glass transition temperature of a polymer was measured at a temperature rising rate of 10° C./min. by a differential scanning calorimeter (DSC). The unit is ° C.

(3) Melt Index:

A melt index of pellets was measured at a temperature of 230° C. or 280° C. by following the JIS-K7210. The unit is g/10 min.

(4) Released Water Amount:

In a stainless test chamber wherein water and organics adhered on the inside surface are completely removed in advance by blowing a high purity argon gas flow while heating at 400° C. for two hours, an ultra high purity argon gas flow (a flow rate: 1.2 L/min.) at a temperature of 25° C. having an impurity concentration of 1 ppb or less was brought to flow.

In the room at a temperature of 25° C. and a relative humidity of 50%, two test pieces having a size of 60 mm by 8 mm and a thickness of 5 mm (a total surface area is 32.8 cm$^2$) were cut from a flange portion of the container, then, the test pieces were immediately placed in the test chamber.

After 300 minutes from a time the test pieces started to contact the high purity argon gas flow, the water amount in the high purity argon gas was measured by an API-MS (UG-400P made by Hitachi Electronics Co., Ltd.) under conditions of a drift voltage of 23.1V, a scan speed of 256 msec/mass. The obtained value was regarded as a water amount released from the test pieces. The unit is ppb (water)/cm$^2$ (test piece).

(5) Released Organic Amount:

Two test pieces having a size of 60 mm by 8 mm and a thickness of 5 mm were cut from the flange portion of the container under the same condition as that in the (4) above and, after confirming that the weight was 4.8 g, stored in a class 100 clean room, then, the next measurement was made within 24 hours.

The test pieces were placed in a stainless test chamber wherein water and organics adhered on the surface were completely removed in the same way as in the method in the above (4), a gas was continuously collected at a temperature of 100° C. for 300 minutes by using a commercially available active carbon tube and analyzed by a TDS-GC-MS, and an accumulated released amount of an organics was measured. The unit is ng (organics)/g (test piece).

(6) Organic Adsorption Amount (Storage Test):

A silicon wafer (Ø: 5 inches) is placed in the hollow portion of a container composed of a container body obtained by injection molding and a stainless cap, and stored at 25° C. under a reduced pressure state (100 torr) for 48 hours.

Next, in a stainless test chamber wherein water and organics adhered on the surface were completely removed, an ultra high purity argon gas at 25° C. having a flow amount of 1.2 L/min. was brought to flow, and the silicon wafer after being stored in the above container was placed therein. An amount of organics adsorbed on the silicon wafer was analyzed by an API-MS in the same way as in the above (4) while raising the temperature to 400° C. at a temperature rising rate of 3° C./min. The unit is ng/cm$^2$ (wafer).

(7) Dielectric Breakdown Characteristic of MOS Capacitor:

A silicon wafer substrate (Ø: 5 inches) is placed in the hollow portion of a container composed of a container body obtained by injection molding and a stainless cap, and stored at 25° C. under a reduced pressure state (100 torr) for 48 hours. An MOS capacitor was produced by using the wafer substrate, a dielectric breakdown characteristic thereof was measured and an injected charge amount (explained later on) at a breakdown probability of 50% was obtained. The larger the injected charge amount (unit: C/cm$^2$), the more superior in the dielectric breakdown characteristic of the MOS capacitor.

MOS Capacitor Production Condition

An MOS capacitor was produced by following steps below in order.

(1) Preparation of Silicon Wafer Substrate:

A silicon wafer substrate having a diameter of 33 mm was produced by cutting out from 6-inch n-type silicon wafer.

(2) Field Oxidization Step:

After washing the silicon wafer, field oxidization was performed under an argon atmosphere.

[Field Oxidization Condition]1000° C.×1 hour/pyrogenic wet oxidization(H$_2$:O$_2$=1:1)

After field oxidization, the wafer substrate was subjected to annealing treatment at 1000° C. in argon for one hour.

(3) Boron Dope (BSG Deposition) Step:

The wafer substrate after field oxidization and annealing processing was subjected to boron dope (addition of boron in silicon) under the normal pressure by the CVD method under the condition below.

[Boron Dope Condition] Processing was performed at 400° C. for 17.5 minutes in a mixed gas of SiH$_4$ (silane), O$_2$ (oxygen) and B$_2$H$_4$ (diborane).

After the boron dope, annealing treatment was performed at 1000° C. for 30 minutes in nitrogen.

(4) Gate Oxidization Film Formation Step:

The wafer substrate after boron dope and annealing treatment was subjected to processing at 900° C. for 5 minutes in oxygen to form a gate oxidization film.

(5) Container Storage Test:

The wafer substrate after forming the gate oxidization film was placed inside the container and stored.

[Storage Condition] Being stored at 25° C. for 48 hours under a reduced pressure state (a pressure of 100 torr)

(6) Polycrystalline Silicon Film Formation (Polysilicon Deposition) Step:

By using the wafer substrate stored in the container, polysilicon deposition was performed under conditions below.

[Polysilicon Deposition Condition] Performed at 600° C. for 20 minutes in a mixed gas of SiH$_4$ (silane) and PH$_3$ (phosphine)

After polysilicon deposition, annealing treatment was performed on the wafer substrate at 850° C. for 30 minutes in nitrogen.

(7) Electrode Layer (Aluminum) Deposition Step:

The wafer substrate after polysilicon deposition and annealing treatment was subjected to aluminum deposition processing.

(8) Defect Portion Hydrogenation (Hydrogen Sintering) Step:

The wafer substrate after aluminum deposition processing was subjected to hydrogen sintering at 400° C. for 30 minutes.

Note that the above steps excepting for the step (5) are a well known MOS capacitor production method. During the above steps, washing, lithography and etching are included.

Dielectric Breakdown Characteristic Measurement Method

A MOS capacitor produced by the above method was stored in the container at 25° C. at 100 torr for 48 hours. Next, a constant current stress was applied to the MOS capacitor under the condition below (time of applying the current stress was gradually changed). An amount of injected charges was obtained from a time of applying the current stress, and breakdown probability for the injection charge amount was plotted to form an analytical curve, and an injection charge amount of attaining breakdown probability of 50% is obtained.

Gate Area: 1×10$^{-4}$ cm$^2$(0.1 mm×0.1 mm) [Condition]

Stress Condition: injecting electrons by 0.1 A/cm$^2$ from gate electrode to substrate side
Oxidization Film Thickness of Sample: 5.0 nm
Measurement System
Measuring Device: MX-1100A made by Vector Semiconductor Co., Ltd.
Measurement Portion: LCR meter, HP4284A (20 Hz to 1 MHz)
Power Source Portion: Switching controller, HP4156A
Computer: HP382

Polymer Production Example 1

Production of Polymer Containing Alicyclic Structure A

In a reactor of a nitrogen atmosphere at the room temperature, 250 parts of dehydrated cyclohexane was put, and 0.84 part of 1-hexene, 0.06 part of dibutyl ether and 0.11 part of triisobutyl aluminum were furthermore put to be mixed, then, while keeping at 45° C., 38 parts of tricyclo[4.3.0.1$^{2,5}$]deca-3-diene (hereinafter, abbreviated to DCP), 35 parts of tetracyclo[4.4.0.1$^{2,5}$.1$^{7,10}$]dodeca-3-ene (hereinafter, abbreviated to TCD), 27 parts of 7,8-benzotricyclo[4.3.0.1$^{2,5}$]deca-3-ene (hereinafter, abbreviated to MTF), and 15 parts of 0.7% toluene solution of tungsten hexachloride were continuously added over 2 hours to perform polymerization. The polymerization conversion rate was 100%.

The obtained polymer reaction solution was moved to a pressure resistant hydrogenation reactor, added with 5 parts of diatomaceus earth carrying nickel catalyst (G-96D, nickel carrying rate was 58 wt % made by Nissan Girdler Co., Ltd.) and 100 parts of cyclohexane to brought to react at 150° C. under a hydrogen pressure of 4.4 MPa for 8 hours. The reaction solution was subjected to pressure filtration (Funda filter made by Ishikawajima-Harima Heavy Industries Co., Ltd.) under a pressure of 0.25 MPa by using a Radiorite #500 as a filter bed to remove the hydrogenation catalyst and obtain a transparent solution without color.

The above solution was added with 0.05 part of antioxidant pentaerythritol tetrakis[3-(3,5-di-t-butyl-4-hydroxyphenyl)propionate] (Irganox made by Chiba-Geigy) with respect to 100 parts of the hydrogenated polymer. Then, the solution was filtrated by a metal fiber filter (pore size of 3 µm made by Nichidai Corporation) and a zeta plus filter 30H (pore size of 0.5 to 1 µm made by Quno Corporation) successively, furthermore, filtrated by a metal fiber filter (pore size of 0.4 µm made by Nichidai Corporation) to remove fine solid content.

Next, cyclohexane as a solvent and low molecular weight components which become a cause of generating an organic gas are removed from the solution by using a cylinder shaped concentration drier (made by Hitachi Ltd.) to recover a DCP-ETD ring-opening polymer hydride. Removing of the solvent and low molecular weight components were performed by divided two steps. Condition of concentration was a temperature of 260° C. under a pressure of 13.4 kPa (100 Torr) in the first step and a temperature of 270° C. under a pressure of 0.7 kPa (5 Torr) in the second step. The ring-opening polymer hydride wherein the solvent and low molecular weight components were removed was extruded in a molten state from a die directly connected to the concentration device in a class 1000 clean room, cooled with water, cut by a pelletizer (OSP-2 made by Osada S.S.) and recovered in pellets. The Mw of the obtained hydrogenated DCP-TCD-MTF ring-opening polymer was 31,000, a ratio of the number of double bond with respect to the number of all carbon-carbon bond was 0.02%, a content of repeating unit not having norbornane ring structure in the polymer was 89%, and the glass transition temperature was 101° C. The melt index was 4.2 g/10 min. at 230° C. and 17.8 g/10 min. at 280° C.

Polymer Production Example 2

Production of Polymer Containing Alicyclic Structure B

Other than using 85 parts of DCP and 15 parts of 8-ethyl-tetracyclo[4.4.0.1$^{2,5}$.1$^{7,10}$]dodeca-3-ene (hereinafter, abbreviated to ETD) instead of 38 parts of DCP, 35 parts of TCD and 27 parts of MTF in the polymer production example 1, and changing the temperature of the first step of removing (concentrating) the solvent and low molecular weight components to 280° C. and that in the second step to 280° C., pellets of a hydrogenated DCP-ETD ring-opening polymer was obtained in the same way as in the polymer production example 1. The Mw of the obtained hydrogenated DCP-ETD ring-opening polymer was 34,000, a ratio of the number of double bond with respect to the number of all carbon-carbon bond was 0.02%, a content ratio of repeating unit not having norbornane ring structure in the polymer was 67%, and the glass transition temperature was 140° C. The melt index was 12.1 g/10 min. at 230° C. and 47.5 g/10 min. at 280° C.

Polymer Production Example 3

Production of Polymer Containing Alicyclic Structure C

In a stainless steel polymerization device provided with a mixer which was sufficiently dried and substituted with nitrogen, 320 parts of anhydrous cyclohexane, 37.5 parts of styrene, and 0.38 part of dibutyl ether were put, then 0.36 part of n-butyl lithium solution (15% containing hexane solution) was added while mixing at 60° C. to start polymerization reaction. After 1 hour of polymerization reaction, 20 parts of a mixed monomer composed of 8 parts of styrene and 12 parts of isoprene was added to the reaction solution to perform polymerization reaction for 1 more hour, 37.5 parts of styrene was furthermore added to react for one hour, then, 0.2 part of isopropyl alcohol was added to the reaction solution to stop the reaction.

As a result, a solution of a triblock copolymer of St-(St/Ip)-St having a block containing a repeating unit originating from styrene (hereinafter, abbreviated to "St") and a block containing a repeating unit originating from styrene and isoprene (hereinafter, abbreviated to "St/Ip") was obtained.

Next, 400 parts of the polymer reaction solution was moved to a pressure resistant reactor provided with a mixer, 10 parts of silica-alumina carrying nickel catalyst (E22U made by Nikki Chemical Co. Ltd.) was added as a hydrogenation catalyst and mixed. Inside the reactor was substituted with a hydrogen gas, furthermore, hydrogen was supplied while mixing the solution, the temperature was kept at 160° C., and reaction was made for 8 hours under a pressure of 4.5 MPa so as to perform hydrogenation also on an aromatic ring.

In the same way as in the polymer production example 1 after the step of removing the hydrogenation solvent, pellets of a hydrogenated St-(St/Ip)-St block copolymer were obtained.

The Mw of the obtained hydrogenated St-(St/Ip-St block copolymer was 84,900, the Mw/Mn was 1.20, a ratio of the number of double bond with respect to the number of all carbon-carbon bond was 0.14%, the glass transition temperature was 127° C., the melt index was 7.2 g/10 min. at 230° C. and 11.3 g/10 min. at 280° C.

Polymer Production Example 4

Production of Polymer Containing Alicyclic Structure D

Other than changing to 0.20 part of 1-hexene, the temperature of the first step of removing (concentrating) the solvent and low molecular weight components to 300° C. and that of the second step to 310° C., in the same way as in the polymer production example 1, pellets of hydrogenated DCP-TCD-MTF ring-opening polymer were obtained. The Mw of the obtained hydrogenated DCP-TCD-MTF ring-opening polymer was 58,000, the Tg was 142° C., a ratio of the number of double bond was 0.09%, a content ratio of a repeating unit not having norbornane ring structure in the polymer was the same as that in the polymer containing alicyclic structure A, and the melt index was 0.08 g/10 min. at 230° C. and 0.5 g/10 min. at 280° C.

Polymer Production Example 5

Production of Polymer Containing Alicyclic Structure E

Other than changing to 1.20 parts of 1-hexene, in the same way as in the polymer production example 1, pellets of hydrogenated DCP-TCD-MTF ring-opening polymer were obtained. The Mw of the obtained hydrogenated DCP-TCD-MTF ring-opening polymer was 24,000, the Tg was 137° C., a ratio of the number of double bond was 0.02%, a content of a repeating unit not having norbornane ring structure in the polymer was the same as that in the polymer containing alicyclic structure A, and the melt index was 34.8 g/10 min. at 230° C. and 125 g/10 min. at 280° C.

Example 1

After storing polymer containing alicyclic structure pellets A in a stainless container by sealing with nitrogen from immediately after producing the pellets for one week, they were preliminarily dried at 110° C. for 4 hours by using a hot air ventilation drier. By using the pellets, injection molding was performed by using an injection molding device at a molten temperature of the resin of 280° C., a cylinder retention time of 3 minutes, a primary injection pressure of 98.1 MPa, and a secondary injection pressure of 78.4 MPa, so that a container body having a shape shown in FIG. 1 (an inner diameter of the hollow portion was 280 mm, a height of the center of the hollow portion was 200 mm, a height of the sidewall was 180 mm, and a thickness of the sidewall was 5 mm) was molded. The melt index measurement values of the pellets and results of measuring a released water amount, a released organic amount, an organic adsorption amount and an injected charge amount at 50% breakdown of a capacitor by using a plate are shown in Table 1.

Example 2

Other than using the pellets after storing in a polyethylene bag without being sealed with nitrogen, in the same way as in the example 1, a container body was obtained by injection molding. The results of evaluating in the same way as in the example 1 are shown in Table 1.

Example 3

Other than using as a polymer the polymer containing alicyclic structure B, and changing the preliminary drying temperature to 90° C. and the molten resin temperature at the time of injection molding to 250° C., a container body was obtained in the same way as in the example 1. The results of evaluating in the same way as in the example 1 are shown in Table 1.

Example 4

Other than using as a polymer the polymer containing alicyclic structure C, a container body was obtained by injection molding in the same way as in the example 1. The results of evaluating in the same way as in the example 1 are shown in Table 1.

Example 5

Other than using the pellets after preliminarily drying at a temperature of 80° C. for 2 hours, a container body was obtained by injection molding in the same way as in the example 1. The results of evaluating in the same way as in the example 1 are shown in Table 1.

Comparative Example 1

Other than using pellets of a polymer D instead of using pellets of the polymer containing alicyclic structure A, and changing the molten temperature of the resin at the time of injection molding to 350° C. and the cylinder retention time to 90 minutes, a container body was obtained in the same way as in the example 1. The results of evaluating in the same way as in the example 1 are shown in Table 1.

Comparative Example 2

Other than using pellets of the polymer E instead of using pellets of the polymer containing alicyclic structure A and changing the molten resin temperature at the time of injection molding to 215° C., a container body was obtained in the same way as in the example 1. The results of evaluating in the same way as in the example 1 are shown in Table 1.

TABLE 1

| | Polymer *1 | M.I. 230° C. (g/10 min.) | M.I. 280° C. (g/10 min.) | Molding Condition *2 | Water Release Amount (ppb/cm$^2$) | Organic Release Amount (ng/g) | Organic Adsorption Amount (ng/cm$^2$) | 50% Breakdown Injection Charge Amount (C/cm$^2$) |
|---|---|---|---|---|---|---|---|---|
| Example 1 | A | 4.2 | 17.8 | 280° C., 3 min. | 1.5 | 20 | 6 | 30 |
| Example 2 | A | 4.2 | 17.8 | 280° C., 3 min. | 1.7 | 30 | 13 | 25 |
| Example 3 | B | 12.1 | 42.5 | 250° C., 3 min. | 1.2 | 28 | 8 | 30 |
| Example 4 | C | 7.2 | 11.3 | 280° C., 3 min. | 3.7 | 25 | 9 | 27 |
| Example 5 | A | 4.2 | 17.8 | 280° C., 3 min. | 2.3 | 35 | 26 | 22 |
| Comparative Example 1 | D | 0.08 | 0.5 | 350° C., 90 min. | 4.8 | 213 | 114 | 8 |

TABLE 1-continued

|  | Polymer *1 | M.I. 230° C. (g/10 min.) | M.I. 280° C. (g/10 min.) | Molding Condition *2 | Water Release Amount (ppb/cm$^2$) | Organic Release Amount (ng/g) | Organic Adsorption Amount (ng/cm$^2$) | 50% Breakdown Injection Charge Amount (C/cm$^2$) |
|---|---|---|---|---|---|---|---|---|
| Comparative Example 2 | E | 34.8 | 125 | 215° C., 3 min. | 32.1 | 176 | 79 | 6 |

Note:
*1 A: polymer containing alicyclic structure A
B: polymer containing alicyclic structure B
C: polymer containing alicyclic structure C
D: polymer containing alicyclic structure D
E: polymer containing alicyclic structure E
*2 Molten resin temperature and cylinder retention time As shown in Table 1, when a thermoplastic resin molded item contains water by an amount that a released amount in an air flow of an ultra high purity argon gas at 25° C. having an impurity concentration of 1 ppb or less and a flow amount of 1.2 L/min. after 300 minutes is 30 ppb or less per a surface area of 1 cm$^2$ of the thermoplastic resin made component, and organics by an amount that an accumulated amount to be released into the air at 100° C. for 300 minutes is 150 ng or less per weight 1 g of the thermoplastic resin made member, organic adsorption amount on silicon wafers was small, so that capacitors produced by using the wafers had remarkably preferable dielectric breakdown characteristics (examples 1 to 5).

Among them, when comparing examples 1, 2 and 5 using the same polymer A, in the case of performing preliminary drying before producing pellets in a higher temperature range than a glass transition temperature of the polymer by 5 to 80° C. (comparing example 1 with example 5) and the case of storing the pellets by being sealed with nitrogen (comparing the example 1 and the example 2), all of the released water amount, released organic amount and organic adsorption amount became less and the 50% breakdown charge injection amount was also increased.

A member with a released water amount or released organic amount exceeding the above ranges exhibited a large organic adsorption amount on the silicon wafer and brought poor dielectric breakdown characteristics of a capacitor (comparison examples 1 and 2).

The invention claimed is:

1. A container for precision substrate having one or more components formed by molding a thermoplastic resin,
   wherein the thermoplastic resin is a polymer resin containing alicyclic structure,
   and the polymer resin containing alicyclic structure has a melt index of 2 to 100 g/10 min., and
   the melt index is a value measured at 280° C. based on the JIS-K7210,
   characterized in that said component satisfies characteristics [1] and [2] below:
   [1] When being brought to contact ultra high purity argon gas (impurity concentration: 1 ppb or less) at 25° C. having a flow rate of 1.2 L/min., a water amount in said argon gas after 300 minutes is 30 ppb or less per a surface area 1 cm$^2$ of the component; and
   [2] When being placed in the air at 100° C., an increase in the amount of organics in the air in 300 minutes is 150 ng or less per weight 1 g of the component.

2. The container for precision substrate as set forth in claim 1, wherein the polymer resin containing alicyclic structure has a glass transition temperature (Tg), measured by a differential scanning calorimeter (DSC) at a temperature rising rate of 10° C./min. of 60 to 200° C.

3. The container for precision substrate as set forth in claim 1, wherein the polymer resin containing alicyclic structure includes 30 to 100 wt % of repeating units originating from a monomer containing alicyclic structure.

4. The container for precision substrate as set forth in claim 1, wherein the polymer resin containing alicyclic structure is a ring-opening (co)polymer of a norbornene based monomer or a hydride of the polymer.

5. The container for precision substrate as set forth in claim 1, wherein the polymer resin containing alicyclic structure has a polymerization conversion rate of 95 wt % or more.

6. The container for precision substrate as set forth in claim 1, wherein the polymer resin containing alicyclic structure has weight average molecular weight (Mw) of 5,000 to 500,000, and the weight average molecular weight is a value in a polyisoprene conversion measured by a gel permeation chromatography (GPC) of a hexane solution or a toluene solution when the polymer resin does not dissolve in hexane.

7. The container for precision substrate as set forth in claim 1, wherein the polymer resin containing alicyclic structure includes 0.15 wt % or less of carbon-carbon-double bond with respect to a total amount of all carbon-carbon bond.

8. The container for precision substrate as set forth in claim 1, wherein the component comprises:
   a container body having an opening portion and capable of housing a precision substrate inside; and
   a container cap capable of forming a closed space between said container body and itself by covering the opening portion of the container body and jointing.

9. The container for precision substrate as set forth in claim 1, wherein the polymer resin containing alicyclic structure has a melt index of 0.1 to 30 g/10 min., and the melt index is a value measured at 230° C. based on the JIS-K7210.

10. A process for producing a container for precision substrate set forth in claim 1, comprising producing a container for precision substrate using a molding material including a preliminarily dried polymer resin containing alicyclic structure having a melt index of 2 to 100 g/10 min., wherein the melt index is a value measured at 280° C. based on the JIS-K7210, and performing injection molding under the conditions below:
   Resin temperature when molding: 220 to 330° C.; and
   Retention time of molten resin in cylinder: 1 hour or shorter.

11. The process for producing a container for precision substrate as set forth in claim 10, wherein the preliminary drying of a polymer resin containing alicyclic structure is performed under a condition of a temperature lower than a glass transition temperature of the polymer resin containing alicyclic structure by 5° C. to 80° C. for 2 hours or longer but not longer than 10 hours.

12. The process for producing a container for precision substrate as set forth in claim 10 or 11, using a molding material stored by being sealed with nitrogen.

13. The process for producing a container for precision substrate as set forth in claim 10 or 11, wherein the polymer resin containing alicyclic structure has a glass transition temperature (Tg), measured by a differential scanning calorimeter (DSC) at a temperature rising rate of 10° C./min. of 60 to 200° C.

14. The process for producing a container for precision substrate as set forth in claim 10 or 11, wherein the polymer resin containing alicyclic structure has a melt index of 0.1 to 30 g/10 min., wherein the melt index is a value measured at 230° C. based on the JIS-K7210.

* * * * *